US011716827B1

(12) United States Patent
Conroy et al.

(10) Patent No.: US 11,716,827 B1
(45) Date of Patent: Aug. 1, 2023

(54) SERVER CHASSIS DEFLECTION DRIVEN BY CABLE TENSIONING

(71) Applicant: Amazon Technologies, Inc., Seattle, WA (US)

(72) Inventors: Ryan F Conroy, Seattle, WA (US); Christopher Mario Gil, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/487,478

(22) Filed: Sep. 28, 2021

(51) Int. Cl.
*H05K 7/14* (2006.01)

(52) U.S. Cl.
CPC ............. *H05K 7/1489* (2013.01); *H05K 7/14* (2013.01); *H05K 7/1485* (2013.01); *H05K 7/1488* (2013.01)

(58) Field of Classification Search
CPC ...... H05K 7/14; H05K 7/1411; H05K 7/1417; H05K 7/1421; H05K 7/1425; H05K 7/1427; H05K 7/1485; H05K 7/1487; H05K 7/1488; H05K 7/1489; H05K 5/02; G06F 1/183; G06F 1/16; A47B 96/02; A47B 96/021; A47B 96/07; A47B 96/14; A47B 96/1441; A47B 96/145; A47B 55/00; A47B 47/042; A47B 2220/09; A47B 43/006; A47F 5/00; B21D 39/034; B21D 39/03; F16B 5/00; B29C 65/62; G01B 5/02; G01B 5/30; G01B 3/20; G01B 3/04; G01B 7/026
USPC .................................................... 361/679.02
See application file for complete search history.

(56) References Cited

U.S. PATENT DOCUMENTS

| 3,444,499 A * | 5/1969 | Lovelace .................. G01L 1/18 257/417 |
| 9,198,321 B1 * | 11/2015 | Heydari ............... H05K 7/1495 |
| 9,854,923 B2 * | 1/2018 | Goppion ................... A47F 5/00 |
| 10,460,589 B1 * | 10/2019 | Srinivasan ........... H05K 7/1497 |
| 2005/0211456 A1 * | 9/2005 | Varghese ............. H05K 7/1487 |
| 2007/0070587 A1 * | 3/2007 | Zielnicki ................. G06F 1/183 361/679.02 |
| 2007/0278911 A1 * | 12/2007 | Vallance ................ A47B 95/00 312/111 |

(Continued)

FOREIGN PATENT DOCUMENTS

KR          20150009270 A  *  1/2015

*Primary Examiner* — Adrian S Wilson
*Assistant Examiner* — Gage Crum
(74) *Attorney, Agent, or Firm* — Kilpatrick Townsend & Stockton LLP

(57) ABSTRACT

A computing equipment box assembly can include a mechanical chassis component, which can include a support sheet configured for supporting computing components. A plurality of passages can be formed through the support sheet. A mechanical cable can be routable down through at least one of the passages and up through at least one other of the passages. A tensioner can be couplable with the cable and adjustable to modify an amount of tension in the cable so as to alter an amount of pre-bow or pre-bend present in the mechanical chassis component. For example, the mechanical cable may be tensioned to apply a force to the support sheet and counteract an upward pre-bend or pre-bow so that the computing components are prevented from protruding into an adjacent upper volume for an upper computer server overhead and from sagging into an adjacent lower volume for a lower computer server underneath.

20 Claims, 6 Drawing Sheets

(56) References Cited

U.S. PATENT DOCUMENTS

| | | | |
|---|---|---|---|
| 2011/0273069 A1* | 11/2011 | Chen | H05K 7/1487 312/352 |
| 2015/0099137 A1* | 4/2015 | Yang | G06F 1/186 428/596 |
| 2015/0122759 A1* | 5/2015 | Shen | A47B 96/00 211/175 |
| 2016/0051044 A1* | 2/2016 | Sabounjian | A47B 47/021 211/186 |
| 2020/0290304 A1* | 9/2020 | Paveletzke | B32B 5/26 |

* cited by examiner

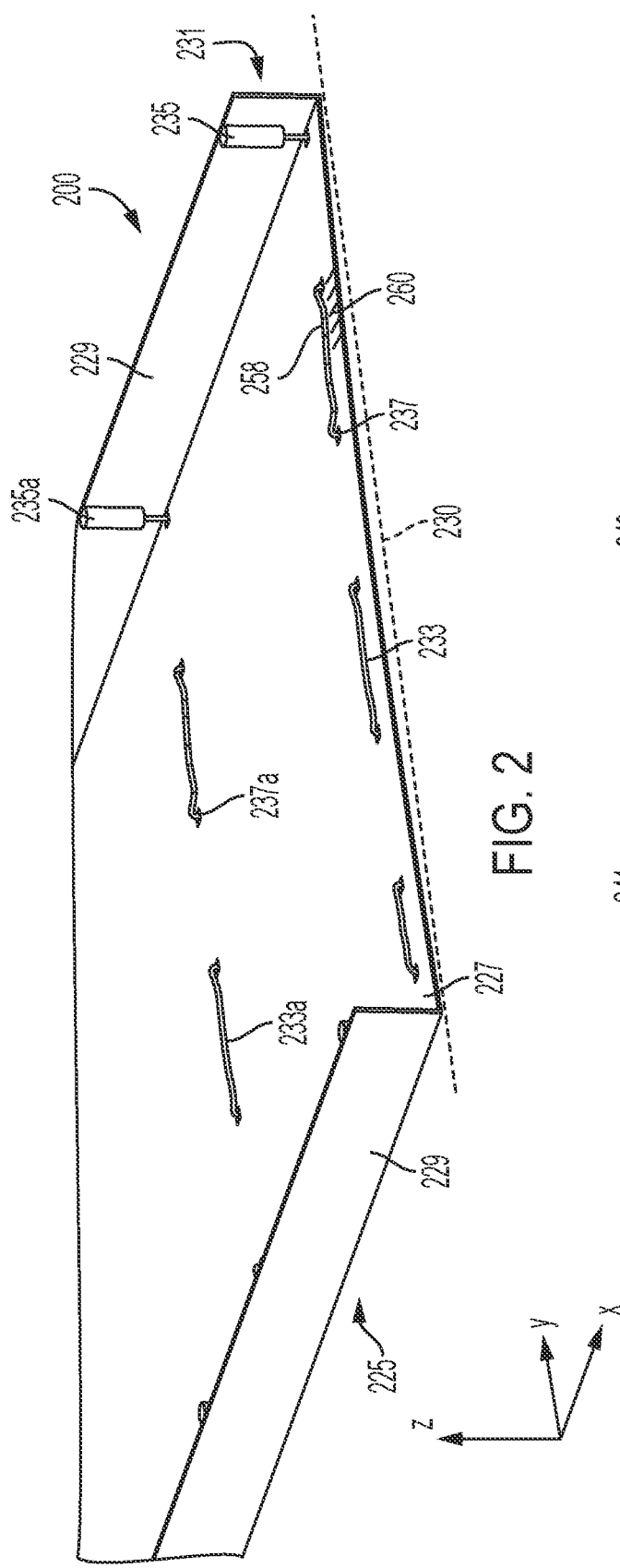
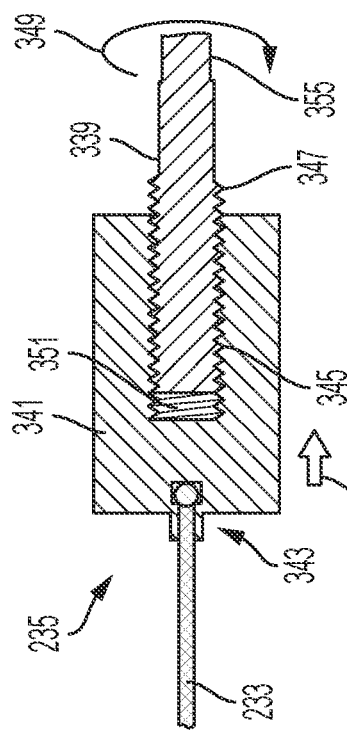
FIG. 2
FIG. 3

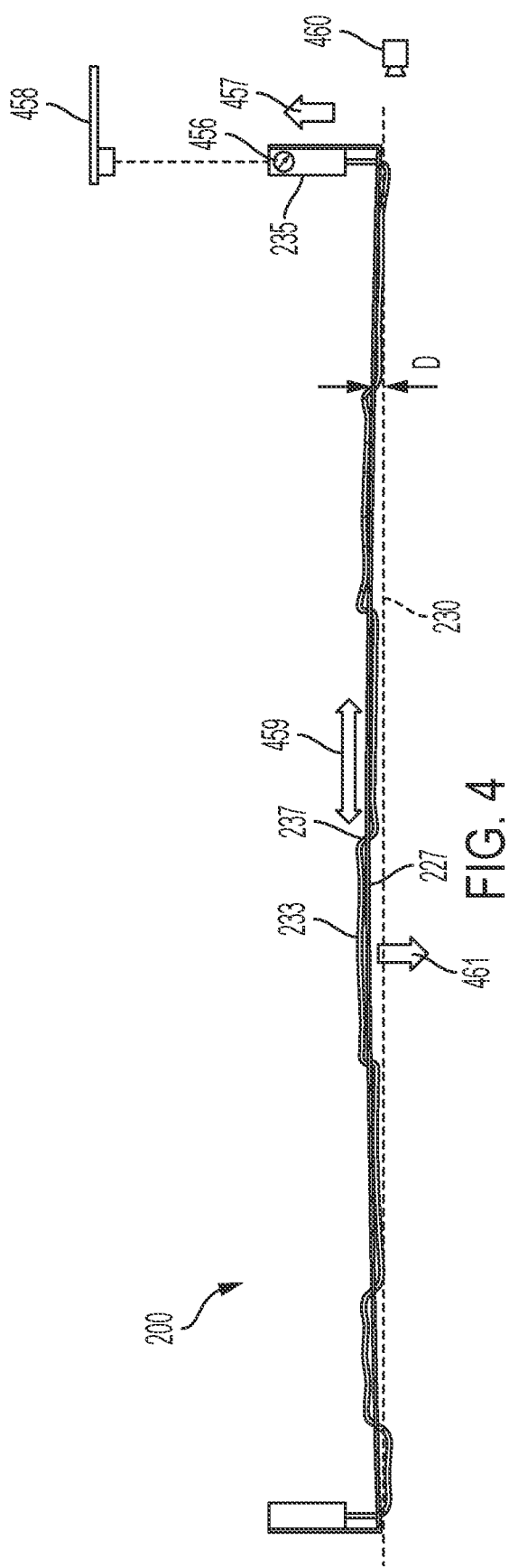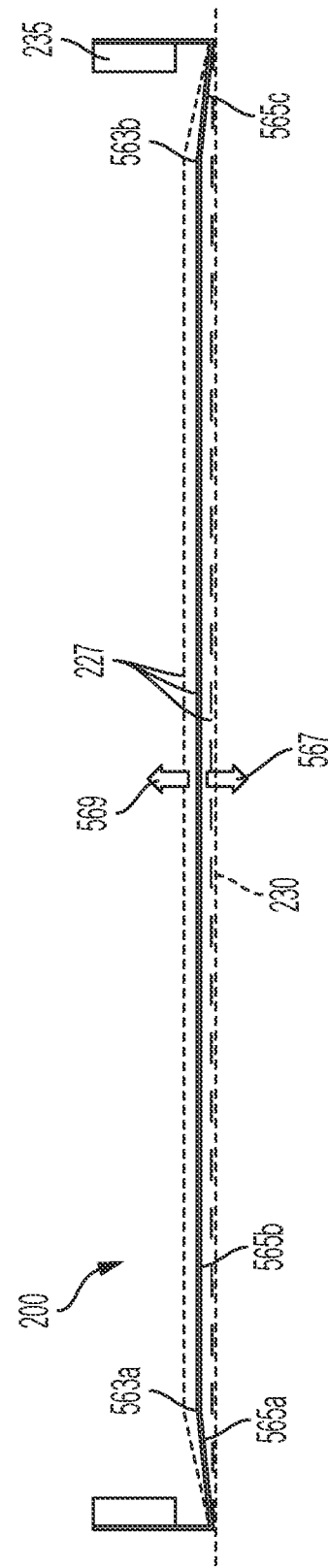

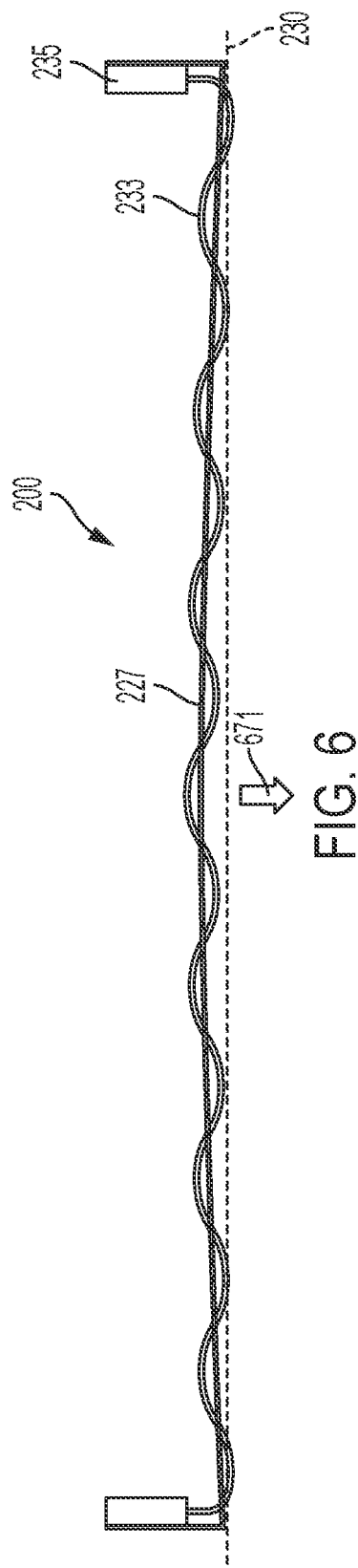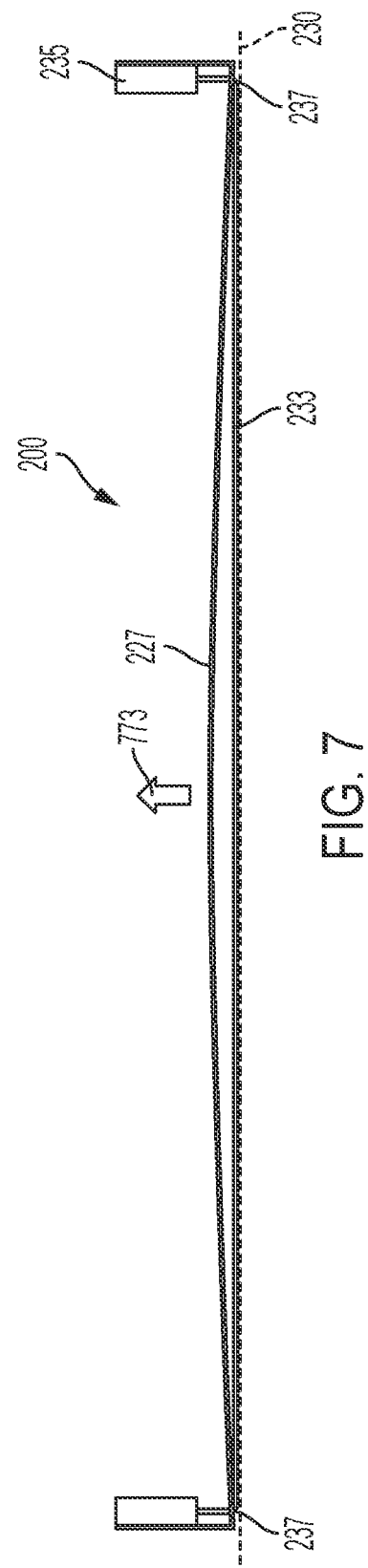

000
SERVER CHASSIS DEFLECTION DRIVEN BY CABLE TENSIONING

BACKGROUND

Many datacenters utilize racks that can hold multiple server chassis or other chassis vertically above one another. Vertically adjacent chassis are often positioned with minimal clearance in between each other in an effort to maximize space usage. The small clearances are typically sufficient to allow a rack-mounted chassis to slide in and out of the rack without impinging or interfering with the next chassis down in the rack. However, some combinations of components that may be desirable to install in a chassis may result in a combined weight payload that may overload a conventional chassis. This may cause a chassis to sag and hamper the sliding of the next chassis down. Alternatively, the risk of such sagging may lead a designer to altogether avoid the otherwise desirable combination of components.

BRIEF DESCRIPTION OF THE DRAWINGS

Various embodiments in accordance with the present disclosure will be described with reference to the drawings, in which:

FIG. 2 illustrates a mechanical chassis component and associated elements that may be utilized in the system of FIG. 1, according to various embodiments;

FIG. 3 illustrates an example of a tensioner that may be utilized with the mechanical chassis component of FIG. 2, according to various embodiments;

FIG. 4 illustrates an end view of a mechanical chassis component for use in the system of FIG. 1 and shows examples of forces acting on an associated mechanical cable in operation, according to various embodiments;

FIG. 5 illustrates an end view of a mechanical chassis component for use in the system of FIG. 1 and shows examples of different states or positions that may be utilized, according to various embodiments;

FIG. 6 illustrates an end view of a mechanical chassis component for use in the system of FIG. 1 and shows an associated mechanical cable weaved back and forth along top and bottom of the mechanical chassis component, according to various embodiments;

FIG. 7 illustrates an end view of a mechanical chassis component for use in the system of FIG. 1 and shows an associated mechanical cable weaved to pass primarily along the bottom of the mechanical chassis component, according to various embodiments;

DETAILED DESCRIPTION

Figure 1:
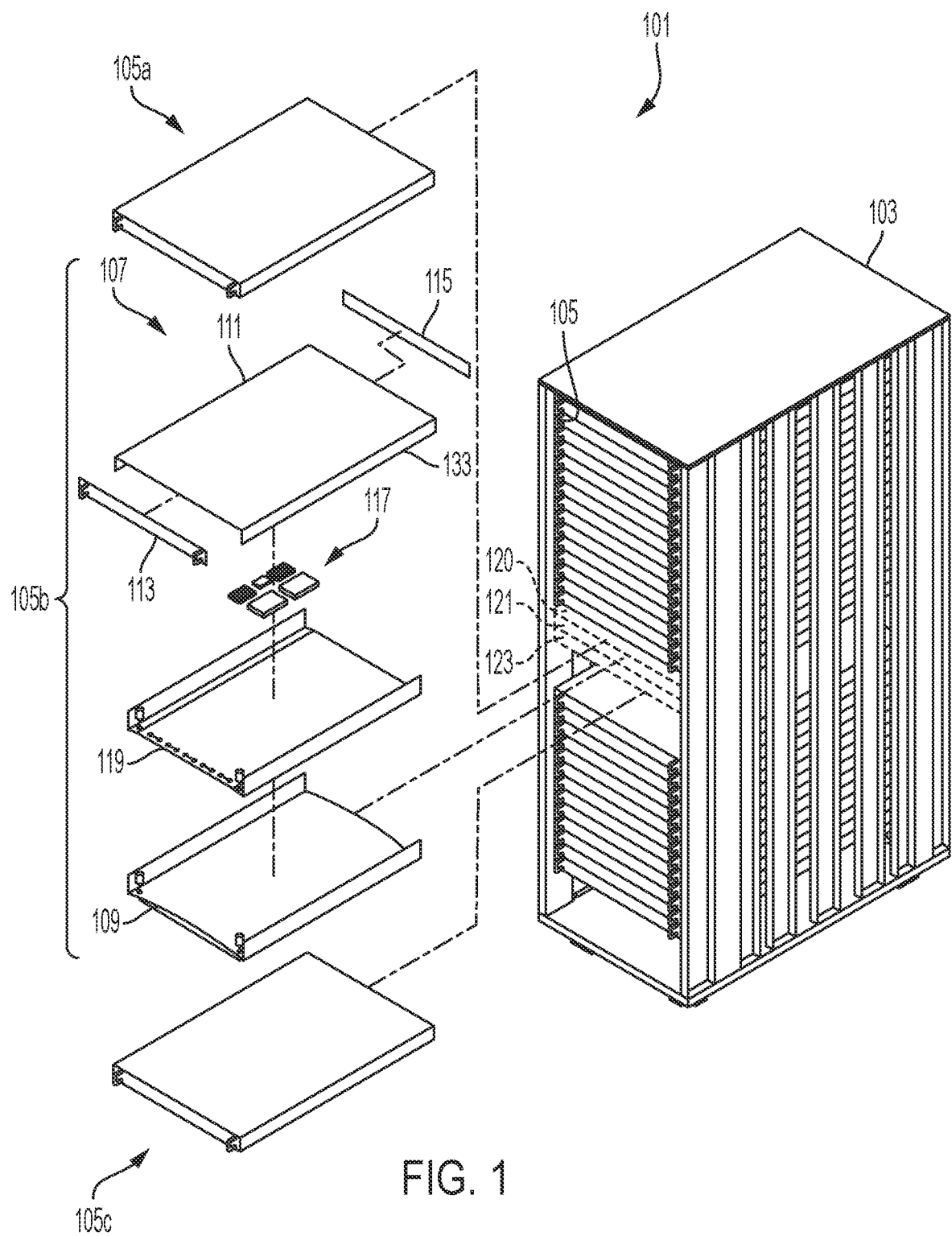
FIG. 1 illustrates a system with sag-resisting features according to various embodiments.

Techniques described herein can relate to assemblies that can mitigate sagging of a rack-mounted chassis. The assemblies may include features that may also avoid overcompensating for sag. For example, the assemblies may provide sufficient sag mitigation to prevent protrusion into a berth below the chassis while also avoiding interference with a berth above the chassis.

In one example, the assembly can include a chassis base or other mechanical chassis component that has been pre-formed to assist in withstanding a weight load of computing components to be received in the mechanical chassis component. For example, the mechanical chassis component may exhibit an arch-like shape, such as may be formed by an overall pre-bow (e.g., with a continuous arc) or with an overall pre-bend (e.g., with a series of bends that each provide an angled interface between respective segments that may be straight or near-straight).

Under the weight load of the particular combination of computing components to be borne, the pre-bow or pre-bend may at least partially flatten, e.g., such that a lowermost point of the mechanical chassis component when loaded is still positioned above or otherwise out of interference with a berth underneath in the rack.

However, it is also possible for the pre-bow or pre-bend to overcompensate for sag and cause issues overhead. For example, if the weight load is under-matched for the degree of pre-bend or pre-bow present, the pre-bow or pre-bend may undergo little flattening and accordingly project upward too much, which may position the computing components too high and/or in interference with other elements above. In use, assemblies herein may address and/or avoid such overcompensation.

For example, continuing the above example, the assembly may further include suitable structure for adjusting an amount of pre-bow or pre-bend in addition to or independent from the weight load of the computing components. The mechanical chassis component may include a series of holes, openings, or other passages through which a cable (or other tension member) may be woven. Tension in the cable may be adjusted, such as by turning a threaded interface coupled with an end of the cable or by otherwise operating a tensioner engaged with the cable. Adjustment of the tension in the cable can in turn modulate a force applied by the cable against the mechanical chassis component. For example, in a scenario in which the cable is woven back and forth to generally follow along an arch-like shape of the mechanical chassis component, use of the tensioner to increase the tension may draw the cable downward and impart a downward, flattening pull on the mechanical chassis component as well (e.g., in response to the increased tension urging the cable toward approximating a straight line between endpoints of the arch and therefore a shorter distance than continuing to follow along the original arch shape). Conversely, for a cable that was previously tensioned, the tensioner may be operated to loosen or otherwise reduce tension, e.g., to permit deflection back upward toward an original amount of pre-bow or pre-bend in the mechanical chassis component. In another scenario, a tensioner may raise tension in a cable extending straight between two passages to impart or increase an amount of pre-bow or pre-bend, and/or the tensioner may reduce tension in the same setup to allow a decrease in the amount of pre-bow or pre-bend.

More generally, the cable and tensioner may be used to increase or decrease from a pre-determined or initial amount of pre-bow or pre-bend. The cable and tensioner may provide such increase or decrease before, during, or after introduction of the computing components. In operation in various examples, a standardized pre-form may be supplied and/or obtained and then adjusted and/or fine-tuned by use of the tensioner and cable to accommodate any one of a number of different weight load scenarios, which may avoid substantial costs that could be incurred for different tooling if different pre-forms with differing pre-bend or pre-bow amounts were instead fabricated for each of the different weight load scenarios. Additionally or alternatively, use of the cable and tensioner to introduce deflection and shift from a relaxed pre-bent state to a deflected state may increase stiffness in the mechanical chassis component (e.g., which may reduce a chance of failure of the system during transit and/or other scenarios where shock and/or vibration may occur).

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates a system 101 according to certain embodiments. The system 101 may be utilized within a datacenter or other environment. The system 101 can include a rack 103, which may correspond to a server rack, for example. The rack 103 can include vertical members, horizontal members, and/or any other suitable structure for supporting rack-mounted units 105. The rack-mounted units 105 may be or include servers and thus will alternatively be referred to as servers 105 herein. However, the rack-mounted units 105 may additionally or alternatively be or include other structures, such as network switches or other units suitable for use in a datacenter, for example.

The servers 105 can be slidably received in the rack 103. In FIG. 1, the system 101 is depicted with three servers 105 outside the rack 103 for purposes of illustration. In FIG. 1, a middle server 105b is depicted in exploded view, while an upper server 105a and a lower server 105c are depicted in assembled states for ease of viewing in comparison. The upper server 105a, lower server 105c, and/or other servers 105 of the rack 103 can be of like construction to that shown for the middle server 105b. Moreover, although various features described with respect to a middle server 105b may be useful to avoid interference with the upper server 105a and/or the lower server 105c, such features may be implemented in any server 105, e.g., regardless of whether the respective server 105 is top-most in a stack, bottom-most in a stack, in a middle position within a stack, and/or whether the respective server 105 has any other positioned above and/or below.

An individual server 105 can include or be coupled with an individual chassis 107. The chassis 107 can include elements of a server box, for example.

The chassis 107 may include a chassis base 109, sometimes alternatively referred to as a chassis base pan. The chassis base 109 may support other elements.

The chassis 107 may include a lid 111. The lid 111 may include or be coupled with a front panel 113 and/or a back panel 115. In some examples, the front panel 113 and/or the back panel 115 may be associated with or coupled with the chassis base 109. For example, the front panel 113 and/or the back panel 115 may be integrally formed with the chassis base 109 and/or the lid 111 or may be separate parts capable of coupling for assembly.

The chassis base 109 may receive the lid 111, e.g., to enclose components within the chassis 107. The chassis 107 may enclose computing components 117, for example. Suitable examples of individual components that may be enclosed within and/or supported by the chassis 107 include a printed circuit board, a fan, a solid state drive (SSD), a hard disk drive (HDD), a graphics processing unit (GPU), a heat sink, a cable, a connector, an interface, and/or other elements that may contribute to a weight payload of the chassis 107. Although listed individually, any of such components may be present singly or in multiples (or absent). In some examples, the combined weight payload of components enclosed within and/or supported by the chassis 107 may pose a risk of causing sagging or other deflection of the chassis base 109 absent other countermeasures.

The system 101 can further include a tray 119. The tray 119 can support the computing components 117 in use, although in some examples, the chassis base 109 may support some or all of the computing components 117 directly (such as if the tray 119 is omitted). The tray 119 can rest on or otherwise engage the chassis base 109. The tray 119 may reinforce the chassis base 109 relative to the load of the computing components 117.

The system 101 may include features that allow the servers 105 to avoid interfering with one another and/or spaces allocated for one another or other elements. For example, in FIG. 1, the server rack 103 is shown with a first or upper volume 120 (e.g., for receiving the upper server 105a), a second or middle volume 121 (e.g., for receiving the middle server 105b), and a third or lower volume 123 (e.g., for receiving the lower server 105c). These may be arranged so that the middle volume 121 is arranged vertically between and adjacent to each of the upper volume 120 and the lower volume 123, for example.

In various examples, when the middle server 105b is received in the middle volume 121 within the rack 103, elements of the chassis 107 may facilitate support of the computing components 117 and prevent sagging of the chassis 107 or related elements into the lower volume 123 that receives the lower server 105c. The chassis 107 may additionally or alternatively arrange computing components 117 to avoid protruding into the upper volume 120 that receives the upper server 105a. The support by the chassis 107 may be facilitated by features of the chassis 107, e.g., as described with respect to FIG. 2 and other figures herein.

FIG. 2 illustrates a mechanical chassis component 200 and associated elements that may be utilized in the system 101. The mechanical chassis component 200 may be, include, or otherwise correspond to the chassis base 109, the tray 119, the lid 111, and/or any other suitable component of the chassis 107. Some features of the mechanical chassis component 200 may be more easily viewed within FIG. 2, and thus some options or features of the mechanical chassis component 200 that are shown in FIG. 2 are omitted in FIG. 1 and in some other figures for the sake of clarity.

As shown by way of example in FIG. 2, the mechanical chassis component 200 can include a body 225. The body 225 includes a support sheet 227. The support sheet 227 may correspond to a bottom panel of the mechanical chassis component 200, for example.

The body 225 is also shown with sidewalls 229 in FIG. 2, although the body 225 may include other combinations of subcomponents, including arrangements in which the sidewalls 229 are omitted or arranged in other orientations relative to the support sheet 227. The sidewalls 229 may extend from the support sheet 227. For example, in scenarios in which the mechanical chassis component 200 corresponds to the chassis base 109, the sidewalls 229 may be sized and arranged to extend upward or to otherwise engage with sidewalls 133 of the lid 111 (e.g., to provide an enclosure in which components of the server 105 are contained). In scenarios in which the mechanical chassis component 200 corresponds to the lid 111, the sidewalls 229 may be or include the sidewalls 133 of the lid 111 (e.g., and may extend downward instead of upward as shown, for example). In scenarios in which the mechanical chassis component 200 corresponds to the tray 119, the sidewalls 229 may be omitted or present and arranged for suitable engagement with other elements of the system 101.

The body 225 may be configured for supporting the computing components 117. For example, the body 225 may be of a sufficient sizing, material, profile, and/or other features suitable for receiving and/or supporting the computing components 117. In various examples, the support sheet 227 and/or other portions of the body 225 may be formed of sheet metal, although plastics or other non-metal materials may be used in addition or substitution. The support sheet 227 may be formed of material that is sufficiently formable to allow the support sheet 227 to transition between flat and curved, bent, or other non-flat form-factors, which may facilitate formation of pre-formed profiles discussed elsewhere herein. The support sheet 227 may be continuous, for example, forming a surface in which it is possible to pass from any one point of the surface to any other without leaving the surface.

In some examples, the support sheet 227 and/or other portion of the body 225 can include one or more mounts, such as brackets or other structures for engaging, supporting, or securing the computing components 117 relative to the support sheet 227. The support sheet 227 and/or other portion of the body 225 may support the computing components 117 so as to be subject to a weight load from the computing components 117. For example, the support sheet 227 may support the computing components 117 from underneath and/or may suspend the computing components 117 from above (e.g., such as in arrangements in which the support sheet 227 forms a portion of the lid 111).

The support sheet 227 can include a pre-formed profile. For comparison, in FIG. 2, a reference line 230 is shown and may represent a horizontal direction or base plane. The profile of the support sheet 227 may include an arch-shape or other shape that extends at least partially upward (e.g., away from the reference line 230).

Suitable examples of the profile of the support sheet 227 may include pre-bow and/or pre-bend shapes. Pre-bow shapes may include a continuous arc. Examples of pre-bow shapes may be seen in the chassis base 109 in FIG. 1 and in the arrangements shown in FIGS. 2, 4, 6, 7, and 8, although pre-bow shapes may be used in other form factors and/or in other components beyond those specific examples depicted. Pre-bend shapes may include one or more bends that each provide an angled interface between respective segments that may be straight or near-straight. Examples of pre-bend shapes may be seen in the tray 119 in FIG. 1 and in the arrangement shown in FIG. 5, although pre-bend shapes may be used in other form factors and/or in other components beyond those specific examples depicted. In the example shown in FIG. 5, the support sheet 227 includes a first bend 563a and a second bend 563b by way of example, although suitable pre-bend shapes may include any suitable number of discrete bends 563 (e.g., including one, two, three, four, five, six, seven, or more than seven).

Referring again to FIG. 2, the profile of the support sheet 227 may be pre-formed. For example, the profile may be pre-formed by stamping, molding, or any other suitable fabrication technique. The profile of the support sheet 227 being pre-formed may correspond to the profile being formed before being subjected to load by the computing components 117 or other elements of the system 101. For example, the pre-bend, pre-bow, or other pre-formed profile may be present in the support sheet 227 in an at rest, relaxed, or unloaded state.

The profile may aid the support sheet 227 in withstanding the weight load of the computing components 117. Under load, the pre-bend, pre-bow, or other pre-formed profile of the support sheet 227 may at least partially flatten or deflect. The profile may be designed so that the amount of flattening or deflection afforded by any weight up to a set maximum will result in positioning that is not sagging into a berth below and/or is otherwise remaining above a lower height threshold. In some examples, the profile may be sized so that all layers of the assembly are within a particular size constraint, such as a within a volume sized to fit within a standardized height of a single rack unit (1U), within a 2U or other multiple of a 1U height, or within another predetermined height.

The magnitude or degree of flattening or deflection may vary at least in part according to magnitude and/or distribution of a payload (e.g., computing components 117 and/or other parts) with which the support sheet 227 is loaded in use. For example, a given pre-formed profile of the support sheet 227 may deflect differently if separately subjected to two different computing components 117 of equal height but differing weights (e.g., the heavier computing component 117 may cause enough deflection so that its top extremity fits underneath a height threshold for the lid 111 or other height limit for the system 101, while the lighter computing component 117 may cause a lesser deflection so that its top extremity exceeds a relevant upper height threshold absent further intervention). However, in various examples, a given pre-formed profile of the support sheet 227 may be used as a starting point or standardized feature that may be further customized or tuned according to the particulars of different loading scenarios by using other features described herein.

The mechanical chassis component 200 can include or be equipped with a tensioning system 231. The tensioning system 231 can include a mechanical cable 233 and a tensioner 235, for example. The tensioning system 231 can also include or interact with passages 237 formed in the mechanical chassis component 200.

The mechanical cable 233 may be or include a cord, strand, string, band, strap, or any other member that is sufficiently flexible to be capable of weaving and/or passing through the passages 237 in the mechanical chassis component 200. The mechanical cable 233 can also be sufficiently strong and/or resilient to permit being tensioned. The mechanical cable 233 may have a round, rectangular, or other cross-sectional shape. Metal, nylon, or any other suitable material may be utilized for the mechanical cable 233. The mechanical cable 233 may be present in addition to electrical cables, optical cables, or any other variety of data and/or power cables used to facilitate operability of computing components 117 etc.

In use, the mechanical cable 233 can be routed through the passages 237. Although six passages are shown in FIG. 2 in a middle of the support sheet 227 (e.g., in addition to a passage 237 visible at a far edge near the tensioner 235), any suitable number of passages 237 can be utilized. Some or all of the passages 237 may correspond to through-holes that pass through a top and a bottom of the support sheet 227. Some or all of the passages 237 may travel underneath an outer surface of the support sheet, such as having entrance and exit both on a top surface, or both on a bottom surface, or split between one on a top surface and one on a bottom surface.

The tensioner 235 can adjust tension in the mechanical cable 233. The tensioner 235 depicted in FIG. 2 is anchored to a sidewall 229, although the tensioner 235 may be anchored at any suitable location. The tensioner 235 may be coupled with one end of the mechanical cable 233 while an opposite end of the mechanical cable 233 is anchored at another suitable location, or tensioners 235 may be present at both ends of the mechanical cable 233. One example of a set of subcomponents that may be present in the tensioner 235 is shown in FIG. 3, although any other types and/or combinations of tension-imparting elements may be utilized.

In some embodiments, the tensioning system 231 can include multiple sets of components. For example, in FIG. 2, a second set is shown spaced along a depth direction X and is depicted as including a second tensioner 235A coupled with a second cable 233A routed through a second series of passages 237A. Although the second set is shown as an identical arrangement, respective sets may vary from one another in numbers of passages 237, weaving patterns, size or type of components, or in other ways to accomplish a desired outcome in the mechanical chassis component 200. Multiple sets may be capable of being tuned individually and/or may otherwise allow tuning different portions of the mechanical chassis component 200 differently or similarly relative to one another to achieve desired shape or loading characteristics for the mechanical chassis component 200. Also, although the second set is shown spaced along a depth direction X, spacing or arrangement may be along any of the depth direction X, the width direction Y, and/or the height direction Z, such as to provide suitable effects in any of such directions individually or in combination.

FIG. 3 illustrates an example of a tensioner 235 that may be utilized with the mechanical chassis component 200. In FIG. 3, the tensioner 235 includes a shaft 339 and a coupler 341. The coupler 341 can be secured to the mechanical cable 233, such as by the over-molded interface 343. Within an opposite end of the coupler 341, a female thread 345 of the coupler 341 engages a male thread 347 of the shaft 339. The shaft 339 may be fixed against translation so that rotation of the shaft 339 (e.g., as illustrated by arrow 349) will cause movement of the female thread 345 along the male thread 347 and shrink a size of a gap 351 within the coupler 341 between the end of the shaft 339 and the end of the opening into the coupler 341. The resulting translational movement of the coupler 341 (e.g., as illustrated by arrow 353) can pull on-and increase tension in-the mechanical cable 233. Conversely, rotating the shaft 339 in the opposite direction can allow opposite translational motion of the coupler 341 and cause or allow reduction in tension in the mechanical cable 233. The shaft 330 may be rotated by engaging a tool-receiving interface 355, such as surfaces for engaging a wrench or screwdriver, for example. However, the tensioner 235 is not limited to the structure shown in FIG. 3. Other options may include ratchet systems and/or any other suitable structure for adjusting tension in the mechanical cable 233.

FIG. 4 illustrates an end view of the mechanical chassis component 200 with forces acting on the mechanical cable 233 in operation. In use, the tensioner 253 can be operated to pull on the mechanical cable 233 (e.g., as illustrated by arrow 457). Pulling on the mechanical cable 233 can take up slack and/or increase tension in the mechanical cable 233 (e.g., as illustrated by arrow 459). As tension increases in the mechanical cable 233, the mechanical cable 233 can be urged toward shortening and/or can accordingly be subject to an overall downward force (e.g., as illustrated by arrow 461, which may be toward the reference line 230). The downward force can press against the support sheet 227 as a result of the mechanical cable 233 being woven through the passages 237 and laying against the surface of the support sheet 227 along the profile of the support sheet 227. Pressing by the mechanical cable 233 can apply a force against the support sheet 227, for example, urging the profile toward flattening or downward deflection (e.g., also illustrated by arrow 461).

An amount of tension and/or deflection present and/or changed by the tensioner 253 may be measured and/or indicated in any suitable manner. In FIG. 4, a gauge 456 is depicted. The gauge 456 may include or be a torque gauge, which may indicate an amount of torque that has been applied to the tensioner 253, e.g., as a measure of corollary tension present. In some embodiments, a separate tool 458 may be releasably engageable with the tensioner 253, cable 233, and/or chassis component 200 for measuring or imparting suitable tension and/or deflection. For example, torque or another relevant setting may be pre-set on the tool 458 for use in adjusting the tensioner 253. The gauge 456 may additionally or alternatively utilize any other suitable measuring technique. In some examples, acoustic measurement may be utilized to detect different sound pitches that may correspond to different levels of tautness or tension in the mechanical cable 233. Optical or visual inspection may additionally or alternatively be used. For example, as may be most easily seen by way of example in FIG. 2, the mechanical cable 233 may include indicators or indicia 258. In some examples, the indicia 258 may correspond to one or more marks, which can be measured in length to determine a corresponding amount of tension present or determine a change in tension that has occurred based on a change in length that has been observed. In some examples, during adjustments in tensioning, the indicia 258 on the mechanical cable 233 may move relative to one or more fiducials 260 on the support sheet 227 or other portion of the mechanical chassis component 200, and allow adjustment to continue until an indicia 258 aligns with a fiducial 260 to indicate a target amount of tension has been reached. In some examples, tension levels and/or variation may be determined based on detecting an amount of deflection that occurs in the support sheet 227 or other portion of the mechanical chassis component 200, such as through visual or optical inspection, information from strain gauges, or any other suitable technique. As an illustrative example, changes in a distance D of a suitable reference point on the mechanical chassis component 200 from the reference line 230 may be tracked by a sensor 460. Suitable examples for the sensor 460 may include a camera or other optical sensor, or a feeler gauge or probe or other structure capable of gap measurement or other positioning detection. Although the sensor 460 is depicted remote from the mechanical chassis component 200, in some embodiments, the sensor 460 may be coupled with and/or suitably arranged within the mechanical chassis component 200.

FIG. 5 illustrates an end view of the mechanical chassis component 200 with examples of different states or positions that may be utilized. Compared to FIG. 4, in FIG. 5, the mechanical cable 233 has been eliminated from view so as to not obstruct the view of other features. FIG. 5 also differs from FIG. 4 in that the mechanical chassis component 200 is shown with a pre-bend instead of with a pre-bow. For example, in FIG. 5, the support sheet 227 includes a first bend 563a and a second bend 563b, which provide transition points among respectively between a first segment 565a (e.g., at a shallow upward acute angle), a second segment 565b (e.g., generally flat), and a third segment 565c (e.g., at a shallow downward acute angle), although bends 563 and/or segments 565 may be utilized in any suitable number and/or shape (e.g., flat, curved, etc.). In any event, principles of operation may be similar regardless of whether a pre-bend or pre-bow is present.

In some examples, the tensioner 235 may be operated to provide an initial amount of tension that may deflect the support sheet 227 to an initial position or state, such as illustrated in solid lines in FIG. 5. In some examples, the tensioner 235 may be operated to add additional tension, which may impart a downward force (such as illustrated by arrow 567) and cause additional deflection (such as to move downward toward the reference line 230 and to the lowered state of the support sheet 227 shown in long-dash lines). Such a downward deflection to diminish a degree or amount of pre-bow or pre-bend may be useful, for example, to accommodate relatively taller computing components 117 or other parts and/or to impart increased stiffness (e.g., to withstand weight loads of relatively heavier items and/or to improve resistance to shock or vibration). For example, increased stiffness may occur in response to an increase in the effective spring rate that may be introduced in the material of the support sheet 227 due to deflection (e.g., which may be temporary, elastic, and/or non-plastic). In some examples, the tensioner 235 may be operated to reduce overall tension, which may cause or permit an upward force (such as illustrated by arrow 569, and which may occur due to a resilience in the support sheet 227 urging movement in response to cessation or reduction in load). The upward force illustrated by arrow 569 may cause, permit, or undo other deflection of the support sheet 227 (such as to move upward away from the reference line 230 and to the raised state of the support sheet 227 shown in short dash lines). Such an upward deflection to increase or augment a degree or amount of pre-bow or pre-bend may be useful, for example, to accommodate relatively shorter computing components 117 or other parts and/or to accommodate relatively heavier items for which a more aggressive pre-bow or pre-bend may be warranted to prevent overall sagging below a minimum height threshold and/or for relatively shorter items).

Figure 8:
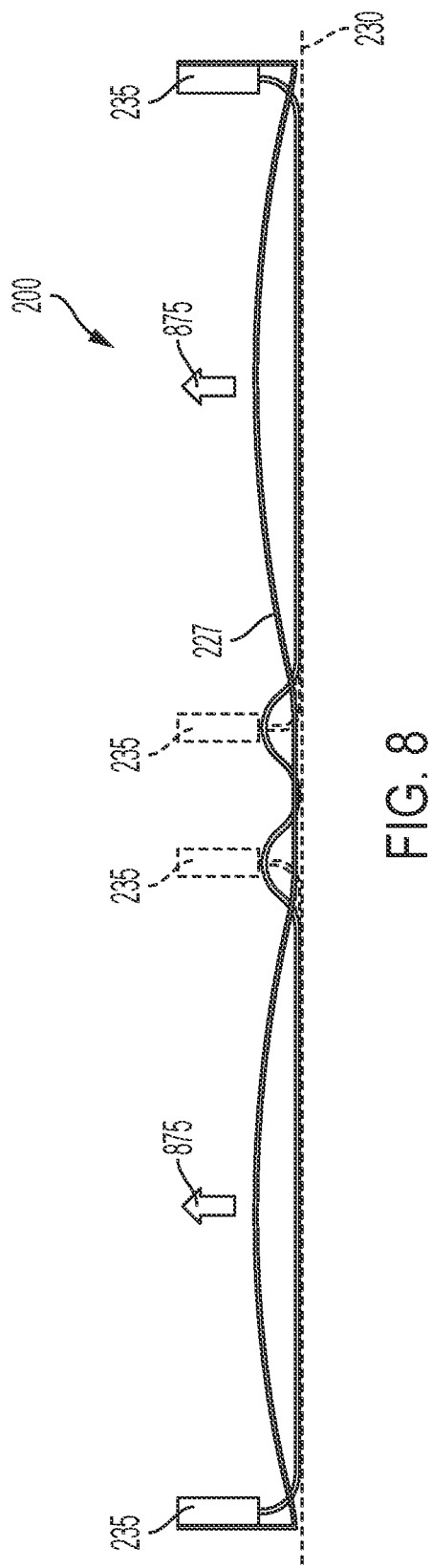
FIG. 8 illustrates an end view of a mechanical chassis component for use in the system of FIG. 1 and shows an associated mechanical cable weaved to provide localized deflection, according to various embodiments.

Although downward deflection in response to increased tensioning (and upward deflection in response to decreased tensioning) has been described with respect to FIG. 5, the mechanical chassis component 200 is not limited to such responses. Responses may differ based on differences in weaving pattern of the mechanical cable 233, for example. Some examples of different possible weaving patterns and corresponding responses are represented in FIGS. 6, 7, and 8. Generally, the tensioner 235 may be adjustable to modify an amount of tension in the mechanical cable 233 so as to alter an amount of force that the mechanical cable 233 applies to the support sheet 227 and thereby set an amount of bow or bend present in the mechanical chassis component 200 in a loaded state in which the computing components 117 are supported by the support sheet 227. Consequently, although the support sheet 227 may be pre-formed with a predetermined amount or extent of pre-bend or pre-bow that causes an uppermost point of the support sheet 227 to be positioned at a predetermined vertical distance from the reference line 230 when at rest or in an unloaded state, the tensioner 235 may act on the mechanical cable 233 to impart a load capable of adjusting the vertical distance of the uppermost point from the reference line 230 (e.g., raising or lowering such uppermost point).

FIG. 6 is an end view of the mechanical chassis component 200 with the mechanical cable 233 weaved back and forth along top and bottom of the mechanical chassis component 200. The mechanical cable 233 may be weaved so as to be generally conformed or in contact against the support sheet 227 once tensioned and may accordingly approximate the profile of the support sheet 227. The mechanical cable 233 may be weaved so as to be generally distributed across the support sheet 227. As illustrated by arrow 671, the support sheet 227 may be subject to a downward deflection (e.g., toward the reference line 230) in response to an increase in tension introduced by the tensioner 235 to the mechanical cable 233 arranged in the weaving pattern shown in FIG. 6.

FIG. 7 is an end view of the mechanical chassis component 200 with the mechanical cable 233 weaved to pass primarily along the bottom of the mechanical chassis component 200. The mechanical cable 233 may be weaved to pass through passages 237 that are sufficiently distant from one another that the mechanical cable 233 is generally out of contact from the support sheet 227. As illustrated by arrow 773, the support sheet 227 may be subject to an upward deflection (e.g., away from the reference line 230) in response to an increase in tension introduced by the tensioner 235 to the mechanical cable 233 arranged in the weaving pattern shown in FIG. 7. For example, opposite ends of the mechanical cable 233 may pull toward one another against the passages 237 to cause pulling of the passages 237 toward one another to impart, increase, or intensify a pre-bend or pre-bow in the support sheet 227. Thus, as may be appreciated with comparison of FIG. 6 and FIG. 7, different responses (e.g., downward deflection or upward deflection) may be achieved in response to tensioning by the tensioner 235 depending on the weaving pattern of the mechanical cable 233.

FIG. 8 is an end view of the mechanical chassis component 200 with the mechanical cable 233 weaved to provide localized deflection. In FIG. 8, the mechanical cable 233 is weaved to pass primarily along the bottom of the mechanical chassis component 200 but also passes briefly to the top toward the center (for ease of viewing, shown as exaggerated upward loops before being tensioned). As illustrated by arrows 875, the support sheet 227 may be subject to two different localized instances of upward deflection (e.g., away from the reference line 230) in response to an increase in tension introduced by the tensioner 235 to the mechanical cable 233 arranged in the weaving pattern shown in FIG. 8. For example, the mechanical cable 233 may pull on the support sheet 227 to impart or increase two different instances of pre-bend at different portions of the support sheet 227. Using suitable weaving patterns of the mechanical cable 233 to cause localized deflection in the support sheet 227 may be useful in situations where different weights, heights, or other sizing of computing components 117 are to be located in different parts of the mechanical chassis component and may accordingly benefit from differing localized amounts of pre-bow or pre-bend.

In some examples, localized deflection or changes to pre-bow or pre-bend may be accomplished at least in part based on location of anchor points for the mechanical cable 233. For example, in FIG. 7, two alternate positions for the tensioner 235 are shown in dashed lines toward a center of the mechanical chassis component 200. In some examples, providing additional or alternate anchor points may permit obtaining of similar deflection patterns with fewer turns in the mechanical cable 233.

Figure 9:
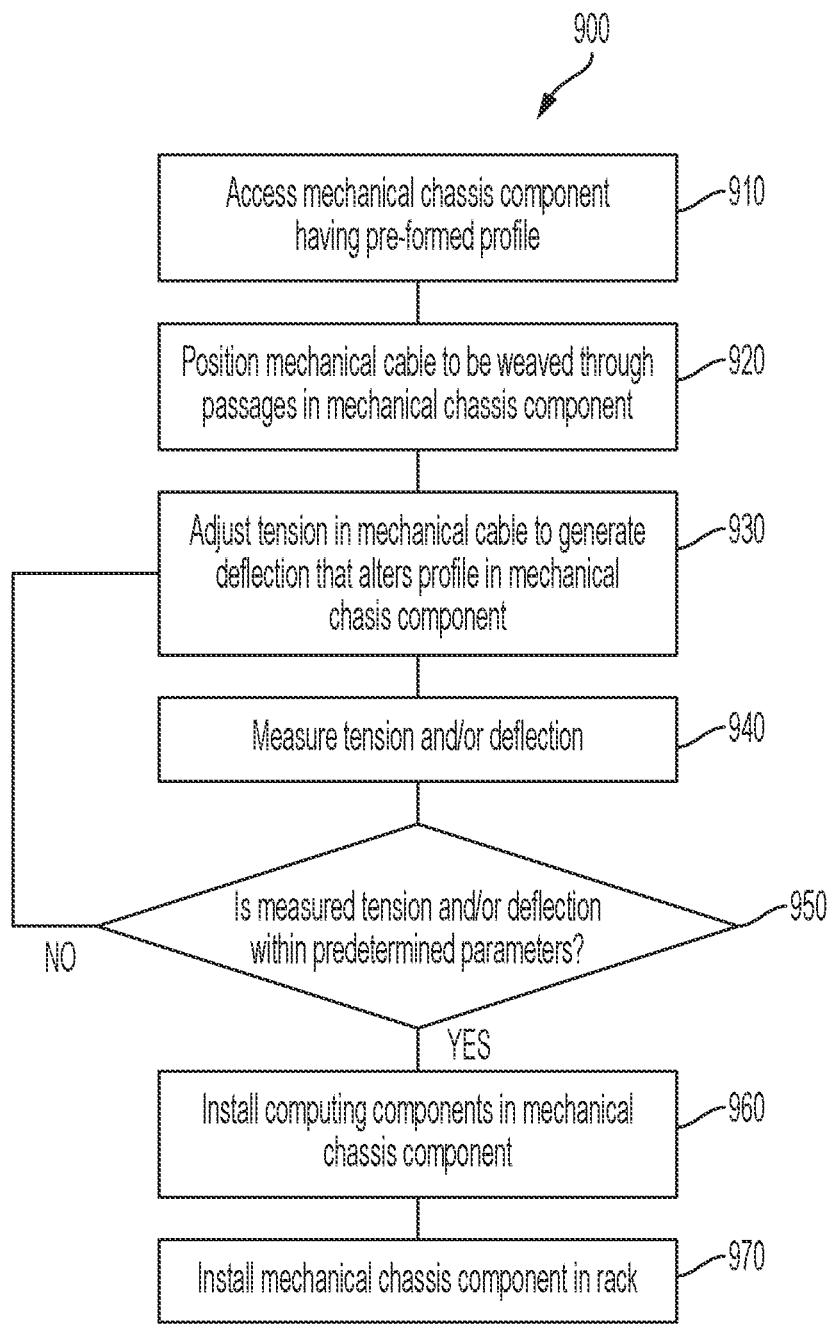
FIG. 9 is a flow chart illustrating an example process of fabrication, assembly, and/or installation of mechanical chassis components for the system of FIG. 1, according to various embodiments.

FIG. 9 is a flow chart illustrating an example process 900 of fabrication, assembly, and/or installation of mechanical chassis components.

The process 900 at 910 can include accessing a mechanical chassis component 200 having a pre-formed profile. For example, the pre-formed profile may correspond to a pre-bend or a pre-bow. The pre-formed profile may be a standardized profile that may be suitable for tuning to a particularized weight load scenario through subsequent acts in the process 900, for example. The act 910 may include forming the profile or receiving the mechanical chassis component 200 with the profile already pre-formed.

The process 900 at 920 can include positioning a mechanical cable 233 to be weaved through passages 237 in the mechanical chassis component 200. The act at 920 can include routing the mechanical cable 233 through the passages 237 or receiving the mechanical chassis component 200 with the mechanical cable 233 already suitably woven in place.

The process 900 at 930 can include adjusting tension in the mechanical cable 233 to generate deflection that alters the profile in the mechanical chassis component 200. For example, the tension in the mechanical cable 233 may be adjusted (e.g., increased or decreased) using the tensioner 235. The act at 930 may include imparting a downward deflection or an upward deflection in response to increasing tension. Respective examples may include FIG. 6 and FIG. 7. The act at 930 additionally or alternatively may include imparting an upward or downward deflection in response to decreasing tension (e.g., which may occur in response to resiliency of material in the mechanical chassis component 200 causing a return toward an unloaded state).

The process 900 at 940 can include measuring tension and/or deflection. For example, the tension in the mechanical cable 233 may be determined by the gauge 456, reference to indicia 258 on the mechanical cable 233 and/or a fiducial 260 on the mechanical chassis component, and/or via other techniques. Additionally or alternatively, the deflection of the mechanical chassis component 200 can be measured by any suitable technique.

The process 900 at 950 can include determining if the measured tension and/or deflection is within predetermined parameters. For example, the act at 950 can include determining if the measured tension and/or deflection is suitable for the loading scenario corresponding to a set of computing components 117 or other parts that are already-or are to be-installed in the mechanical chassis component 200. In some examples, the parameters may be determined based on experimentation previously performed with respect to other acts in the process 900.

If the measured tension and/or deflection is not within the predetermined parameters (e.g., "NO" at 950), the process 900 may return to act 930, for example, to allow for further adjustment toward meeting the parameters. If the measured tension and/or deflection is within the predetermined parameters (e.g., "YES" at 950), the process may continue to act 960.

The process 900 at 960 can include installing computing components 117 in the mechanical chassis component 200. This may include the computing components 117 being installed in the mechanical chassis component 200 that has had its pre-formed profile adjusted to be ready for the load scenario applicable to the computing components 117 utilized. More generally, the act at 960 may be performed after, during, or before other acts in the process 900. For example, in some scenarios, computing components 117 may be installed before tension is adjusted at 930 (e.g., such that the computing components 117 are providing an initial load that may be impacting the pre-bow or pre-bend of the profile, and the tensioning is providing an additional adjustment to the pre-bow or pre-bend of the profile), or the computing components 117 may be installed after tension is adjusted at 930 (e.g., such that the tensioning provides an initial load that may be impacting the pre-bow or pre-bend of the profile, and the subsequent introduction of the computing components 117 provides an additional load that may further impact or interact with the profile).

The process 900 at 970 can include installing the mechanical chassis component 200 in a rack 103. For example, this may include installation of the mechanical chassis component 200 as an element of the chassis 107 so that the chassis 107 or associated components will not interfere with an adjacent berth (e.g., above or below). More generally, the act at 970 may be performed after, during, or before other acts in the process 900. For example, installation in the rack 103 may occur after tensioning at 930 (such as in a scenario of initially installing a tuned mechanical chassis component 200 in a datacenter or other environment) or may occur before tensioning at 930 (such as in a maintenance scenario in which the mechanical chassis component 200 is already installed but is being updated or repaired to alter the profile to fix or prevent interference with adjacent features of the system 101).

Other variations are also possible. Overall, acts in the process 900 can be performed in any suitable order or sub-combination suitable for activity by equipment providers or technicians in any phase of equipment useful life, which may include original fabrication, shipping/delivery, and/or in-field installation, maintenance, repair, and/or decommissioning.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A server rack assembly, the assembly comprising:
   a server rack defining at least a lower volume, an upper volume, and a middle volume positioned vertically between and adjacent to each of the upper volume and the lower volume;
   an upper server received in the upper volume;
   a lower server received in the lower volume; and
   a middle server received in the middle volume, the middle server comprising:
      a chassis base having a support sheet, the support sheet pre-formed with a predetermined amount of upward pre-bend or pre-bow, the support sheet having a plurality of openings;
      computing components supported by the support sheet so that the support sheet is subject to a weight load from the computing components;
      a mechanical cable weaved through the plurality of openings and anchored at a first end; and
      a tensioner coupled with a second end of the mechanical cable and operable to adjust tension in the mechanical cable so that the mechanical cable applies a force to the support sheet to supplement the weight load from the computing components and counteract the upward pre-bend or pre-bow by an amount configured to prevent the computing components from protruding into the upper volume and to prevent the chassis base from sagging into the lower volume.

2. The server rack assembly of claim 1, wherein the computing components comprise at least one of a printed circuit board, a fan, a solid state drive, a hard disk drive, a graphics processing unit, a heat sink, a cable, a connector, or an interface.

3. The server rack assembly of claim 1, further comprising at least one of:
   a tool configured to engage the tensioner and to impart a predetermined amount of torque for causing the tensioner to modify an amount of tension in the mechanical cable; or
   a sensor arranged to detect an amount of deflection of the chassis base.

4. The server rack assembly of claim 1, wherein the middle server further comprises:
   a lid engageable with the chassis base to enclose the computing components within the middle server; and
   a tray received by the support sheet, wherein the tray is supported by the support sheet and subject to the weight load from the computing components such that the computing components are supported by the support sheet by way of the tray.

5. A computing equipment assembly, comprising:
   a mechanical chassis component comprising a support sheet, the support sheet pre-formed with a predetermined amount of pre-bend or pre-bow, the support sheet defining a plurality of passages formed therethrough;
   a mechanical cable woven through the plurality of passages so as to be routed down through at least one of the passages and up through at least one other of the passages; and
   a tensioner coupled with the mechanical cable and adjustable to modify an amount of tension in the mechanical cable so as to alter an amount of force that the mechanical cable applies to the support sheet and thereby impart a change away from the predetermined amount of pre-bow or pre-bend in the support sheet; and
   computing components supported by the support sheet with the support sheet subjected to the change from the predetermined amount of pre-bow or pre-bend imparted by the tensioner and mechanical cable.

6. The computing equipment assembly of claim 5, wherein the support sheet being pre-formed with a predetermined amount of pre-bend or pre-bow causes an uppermost point of the support sheet to be positioned at a predetermined vertical distance from a reference plane, and wherein the predetermined vertical distance is altered in response to the tensioner modifying the amount of tension in the mechanical cable.

7. The computing equipment assembly of claim 5, wherein the mechanical chassis component comprises a chassis base pan, a tray, or a lid.

8. The computing equipment assembly of claim 5, further comprising a gauge configured to indicate an amount of tension present or changed in the mechanical cable.

9. The computing equipment assembly of claim 5, further comprising an indicator located on the mechanical cable and arranged for indicating an amount of tension present or changed in the mechanical cable.

10. The computing equipment assembly of claim 5, further comprising a fiducial located on the mechanical chassis component and arranged for indicating an amount of tension present or changed in the mechanical cable based on a position of the mechanical cable relative to the fiducial.

11. The computing equipment assembly of claim 5, wherein the mechanical cable is a first mechanical cable and the tensioner is a first tensioner, wherein the computing equipment assembly further comprises a second mechanical cable offset along the mechanical chassis component and coupled with a second tensioner operable to adjust tension in the second mechanical cable independently of the first mechanical cable.

12. The computing equipment assembly of claim 5, wherein the computing equipment assembly is incorporated into a server rack assembly for a datacenter, the server rack assembly comprising:
- a server rack defining at least a lower volume, an upper volume, and a middle volume positioned vertically between and adjacent to each of the upper volume and the lower volume;
- an upper server received in the upper volume;
- a lower server received in the lower volume; and
- a middle server received in the middle volume, the middle server comprising the computing equipment assembly;
- wherein the middle server further comprises a chassis base comprising the mechanical chassis component, wherein the predetermined amount of pre-bend or pre-bow present in an unloaded state comprises upward pre-bend or pre-bow;
- wherein the computing components are supported by the support sheet so that the support sheet is subject to a weight load from the computing components;
- wherein the mechanical cable is anchored at a first end; and
- wherein the tensioner is coupled with a second end of the mechanical cable and operable to adjust tension in the mechanical cable so that the mechanical cable applies a force to the support sheet to supplement the weight load from the computing components and counteract the upward pre-bend or pre-bow by an amount configured to prevent the computing components from protruding into the upper volume and to prevent the chassis base from sagging into the lower volume.

13. A computing equipment box assembly, comprising:
- a mechanical chassis component comprising:
  - a support sheet configured for supporting computing components; and
  - a plurality of passages through the support sheet;
- a mechanical cable routed down through at least one of the passages and up through at least one other of the passages; and
- a tensioner coupled with the mechanical cable and adjusted to modify an amount of tension in the mechanical cable so as to alter an amount of pre-bow or pre-bend present in the mechanical chassis component.

14. The computing equipment box assembly of claim 13, wherein the mechanical chassis component further comprises sidewalls extending from the support sheet, and wherein the tensioner is mounted on one of the sidewalls.

15. The computing equipment box assembly of claim 13, wherein the mechanical cable is routed for localized deflection to alter the amount of pre-bow or pre-bend present in one portion of the mechanical chassis component more than in another portion of the mechanical chassis component.

16. The computing equipment box assembly of claim 13, wherein the mechanical cable is routed so as to be weaved at least partially along a top side of the mechanical chassis component and at least partially along a bottom side of the mechanical chassis component.

17. The computing equipment box assembly of claim 13, wherein the mechanical chassis component comprises a chassis base pan.

18. The computing equipment box assembly of claim 13, wherein the mechanical chassis component comprises a tray configured to be received within a chassis base pan.

19. The computing equipment box assembly of claim 13, wherein the mechanical chassis component comprises a lid configured to be coupled with a chassis base pan.

20. The computing equipment box assembly of claim 13, wherein the computing equipment box assembly is incorporated into a server rack assembly for a datacenter, the server rack assembly comprising:
- a server rack defining at least a lower volume, an upper volume, and a middle volume positioned vertically between and adjacent to each of the upper volume and the lower volume;
- an upper server received in the upper volume;
- a lower server received in the lower volume; and
- a middle server received in the middle volume, the middle server comprising the computing equipment box assembly;
- wherein the middle server further comprises a chassis base comprising the mechanical chassis component, wherein the support sheet is pre-formed with a predetermined amount of upward pre-bend or pre-bow;
- wherein the middle server further comprises computing components that are supported by the support sheet so that the support sheet is subject to a weight load from the computing components;
- wherein the mechanical cable is weaved through the plurality of passages and anchored at a first end; and
- wherein the tensioner is coupled with a second end of the mechanical cable and operable to adjust tension in the mechanical cable so that the mechanical cable applies a force to the support sheet to supplement the weight load from the computing components and counteract the upward pre-bend or pre-bow by an amount configured to prevent the computing components from protruding into the upper volume and to prevent the chassis base from sagging into the lower volume.

* * * * *